(12) United States Patent
Jung et al.

(10) Patent No.: US 6,388,281 B1
(45) Date of Patent: May 14, 2002

(54) TRIPLE METAL LINE 1T/1C FERROELECTRIC MEMORY DEVICE AND METHOD FOR FABRICATION THEREOF

(75) Inventors: Dong-Jin Jung, Suwon; Ki-Nam Kim, Kyunggi-do, both of (KR)

(73) Assignee: Samsung Electronics Co. Ltd., Kyungki-do (KR)

( * ) Notice: Subject to any disclaimer, the term of this patent is extended or adjusted under 35 U.S.C. 154(b) by 0 days.

(21) Appl. No.: 09/617,912

(22) Filed: Jul. 17, 2000

(30) Foreign Application Priority Data

Jul. 26, 1999 (KR) .............................. 99-30398

(51) Int. Cl.⁷ ...................... H01L 29/76; H01L 27/108
(52) U.S. Cl. .................. 257/295; 257/295; 257/298
(58) Field of Search ............................ 257/295, 298, 257/303, 310; 438/3; 361/301.4

(56) References Cited

U.S. PATENT DOCUMENTS

| | | | |
|---|---|---|---|
| 5,119,154 A | 6/1992 | Gnadinger | 357/23.6 |
| 5,591,663 A | 1/1997 | Nasu et al. | 437/60 |
| 5,796,136 A * | 8/1998 | Shinkawata | 257/306 |
| 5,854,104 A | 12/1998 | Onishi et al. | 438/240 |
| 5,923,062 A * | 7/1999 | Ohno | 257/298 |
| 6,051,858 A * | 4/2000 | Uchida et al. | 257/295 |
| 6,225,185 B1 * | 5/2001 | Yamazaki et al. | 438/396 |
| 6,246,082 B1 * | 6/2001 | Mitarai et al. | 257/295 |
| 2001/0013614 A1 * | 8/2001 | Joshi et al. | 257/295 |

* cited by examiner

Primary Examiner—Jerome Jackson, Jr.
Assistant Examiner—Joseph Nguyen
(74) Attorney, Agent, or Firm—Lee & Sterba, P.C.

(57) ABSTRACT

Disclosed is a triple metal line 1T/1C ferroelectric memory device and a method to make the same. A ferroelectric capacitor is connected to the transistor through a buried contact plug. An oxidation barrier layer lies between the contact plug and the lower electrode of the capacitor. A diffusion barrier layer covers the ferroelectric capacitor to prevent diffusion of material into or out of capacitor. As a result of forming the oxidation barrier layer, the contact plug is not exposed to the ambient oxygen atmosphere thereby providing a reliable ohmic contact between the contact plug and the lower electrode. Also, the memory device provides a triple interconnection structure made of metal, which improves device operation characteristics.

10 Claims, 8 Drawing Sheets

TRIPLE METAL LINE 1T/1C FERROELECTRIC MEMORY DEVICE AND METHOD FOR FABRICATION THEREOF

BACKGROUND OF THE INVENTION

1. Field of the Invention

The present invention relates to a ferroelectric memory device, and more particularly to a triple metal line, one transistor and one capacitor (1T/1C) ferroelectric memory device and a method for fabrication thereof.

2. Background of the Invention

Modern data processing systems require that a substantial portion of the information stored in their memory be randomly accessible to ensure rapid access to such information. Ferroelectric random access memories (FRAMs) have been proposed because of their high-speed operational speeds. FRAMs also exhibit a significant advantage of being non-volatile. This is achieved by the fact that a ferroelectric capacitor includes a pair of capacitor electrodes having ferroelectric material placed in between. FRAMs have two different, stable polarization states, which can be defined with a hysteresis loop by plotting polarization against applied voltage. Ferroelectric memory elements are programmable with less than 5V (flash memory requires about 18 to 22V), have a small access time (less than 40 nsec access time whereas a flash memory requires a few microseconds), and offer virtually an unlimited number of read and write cycles. These memory elements also consume little power and exhibit alpha-particle immunity.

The non-volatile ferroelectric memory device includes a transistor that is electrically connected to an associated ferroelectric capacitor. There are two ways of interconnecting the source of the transistor to the ferroelectric capacitor. One way is through formation of a local metal interconnection, as disclosed in U.S. Pat. No. 5,119,154, the disclosure of which is incorporated herein by reference. An alternative way of interconnecting the source of the transistor to the ferroelectric capacitor is through formation of a contact plug using a conductive material, such as polysilicon or tungsten (W). For a high density, non-volatile ferroelectric memory device, the latter method is preferred in order minimize unit cell size. As a result, a local interconnection between the transistor and the ferroelectric capacitor is made via a contact plug. The disclosures of U.S. Pat. No. 5,854,104 and U.S. Pat. No. 5,591,663 are incorporated herein by reference.

FIGS. 1A to 1E are cross-sectional views of a semiconductor substrate illustrating a process for fabricating a non-volatile semiconductor memory device according to the prior art.

Referring to FIG. 1A, a semiconductor substrate 1 includes thereon an isolation region 2 and a transistor. The transistor includes a gate oxide layer 3, a gate electrode 4, a source region 5a, and a drain region 5b. A bit line 6, which is electrically connected to the source region 5a, is also formed. A borophosphosilicate glass (BPSG) layer 7 is deposited on the resulting structure. Then a titanium dioxide (TiO2) film 8 (about 1,000 angstroms thick), serving as a diffusion barrier layer for a ferroelectric film, is formed by a reactive sputtering method. A contact hole 20 is then formed by using a photolithographic process.

Referring to FIG. 1B, a double-layer film 10, composed of a titanium (Ti) film (about 500 angstroms thick) and a titanium nitride (TiN) film (about 1,000 angstroms thick), and a blanket layer of tungsten (W) 11 (about 5,000 angstroms thick) are formed by a sputtering method in order to fill the contact hole 20. Then the tungsten (W) film 11 and the titanium nitride/titanium (TiN/Ti) double-layer film 10 are etched back by a chemical mechanical polishing (CMP) method to form a contact plug.

Referring to FIG. 1C, a titanium nitride (TiN) film 12 (about 500 angstroms thick) and a platinum (Pt) film 13 (about 500 angstroms thick) are sequentially formed by a sputtering method. Using a patterned resist 9b, the platinum (Pt) film 13 and the titanium nitride (TiN) film 12 are dry etched to form the lower electrode.

Referring to FIG. 1D, a lead zirconate titanate (PZT) film 14 (about 2,000 angstroms thick) is formed on the lower electrode by a sol-gel method, a sputtering method or a metal-organic chemical vapor deposition (MOCVD) method, and is then annealed. A platinum (Pt) film 15 (about 1,000 angstroms thick), a titanium nitride (TiN) film 16 (about 500 angstroms thick), and an aluminum (Al) film 17 (about 1,000 angstroms thick) are sequentially formed on the PZT film 14. These films are dry etched using a high-density plasma system and mask resist 9c to form the ferroelectric capacitor.

After the capacitor is formed in the aforesaid manner, an insulating layer 18 is formed over the resulting ferroelectric capacitor and titanium oxide (TiO2) layer 8, as depicted in FIG. 1E.

According to the above-mentioned method, the formation of the PZT film 14 is preceded by the patterning of the lower electrode. Namely, after the formation of the lower electrode, high temperature annealing at about 600 to 800 degrees C., in an ambient oxygen atmosphere is carried out on the deposited PZT film 14 in order to form a perovskite crystalline. Furthermore, a diffusion barrier layer formed by high temperature annealing above 500 degrees C. in an ambient oxygen atmosphere is required to improve barrier characteristics. The aforementioned high temperature annealing processes cause oxidation at the interface between the lower electrode and the contact plug. Oxidation still occurs at the interface between the titanium nitride (TiN) film and the contact plug due to the diffusion of oxygen through the sidewall of the stacked ferroelectric capacitor. Such oxidation at the interfaces cannot produce a reliable electrical ohmic contact. As a result, it can be very difficult to deliver the stored data in the ferroelectric capacitor to the data line, thereby degrading the performance of the memory device.

SUMMARY OF THE INVENTION

Therefore, the present invention was made in view of the above problem and is directed towards providing a non-volatile ferroelectric memory device and a method for fabrication thereof. More particularly, the present invention provides a triple metal line 1T/1C ferroelectric memory device. The present invention also provides a method for the fabrication of the triple metal line 1T/1C ferroelectric memory device.

Preferably, an embodiment of the present invention includes a method for fabricating a ferroelectric device comprising the steps of forming an interlayer insulating layer on a semiconductor substrate, the interlayer insulating layer having a buried contact plug therein; forming an oxidation barrier layer on the interlayer insulating layer and on the contact plug to prevent oxidation of the contact plug; forming a ferroelectric capacitor and a diffusion barrier layer pattern on the oxidation barrier layer, the ferroelectric capacitor being aligned over the contact plug and the diffusion barrier layer covering the ferroelectric capacitor; and etching the exposed oxidation barrier layer by the diffusion barrier layer pattern.

A feature of the present invention is that an upper electrode of the ferroelectric capacitor is patterned prior to or simultaneously with the patterning of the ferroelectric film and lower electrode. The patterning of the oxidation barrier layer is done after forming the ferroelectric capacitor and after depositing and subsequently high temperature annealing the diffusion barrier layer in an ambient oxygen atmosphere. As a result, a reliable electrical ohmic contact between a buried contact plug and a lower electrode of the ferroelectric capacitor is obtained.

In accordance with the present invention, there is a method provided for fabricating a non-volatile ferroelectric memory device. The method is comprised of forming an interlayer insulating layer on a semiconductor substrate, the interlayer insulating layer having a buried contact plug therein; forming an oxidation barrier layer on the interlayer insulating layer and the contact plug in order to prevent oxidation of the contact plug; forming a ferroelectric capacitor over the contact plug; forming a diffusion barrier layer on the oxidation barrier layer and on the ferroelectric capacitor; patterning the diffusion barrier layer to cover the ferroelectric capacitor; and etching the exposed oxidation barrier layer by the pattern of the diffusion barrier layer.

In accordance with another embodiment of the present invention, there is provided a method for fabricating a non-volatile triple metal line ferroelectric memory device. The method is comprised of forming a transistor including a gate electrode and source/drain regions on a semiconductor substrate; forming a first interlayer insulating layer over the semiconductor substrate and the transistor; forming a first metal line, which is electrically connected to one of the source/drain regions, on the first interlayer insulating layer; forming a second interlayer insulating layer over the first interlayer insulating layer and the first metal line; forming a contact plug, which is electrically connected to the other of the source/drain regions through the second and first interlayer insulating layers; forming a ferroelectric capacitor, which is electrically connected to the contact plug, on the second interlayer insulating layer; forming a third interlayer insulating layer over the second interlayer insulating layer and the ferroelectric capacitor; forming a second metal line, which is electrically connected to the gate electrode, on the third interlayer insulating layer; forming a fourth interlayer insulating layer over the third interlayer insulating layer and the second metal line; and forming a third metal line, which is electrically connected to the ferroelectric capacitor, on the fourth interlayer insulating layer.

In accordance, still another feature of the present invention, there is provided a triple metal line 1T/1C ferroelectric memory device. The ferroelectric memory device comprises a transistor that has a gate electrode and source/drain regions formed on a semiconductor substrate; a first interlayer insulating layer formed on the transistor and on the substrate; a first metal line, which is electrically connected to one of the source/drain regions, through the first interlayer insulation layer; a second interlayer insulating layer formed on the first interlayer insulating layer and the first metal line; a ferroelectric capacitor, which is electrically connected to the other of the source/drain regions through the contact plug formed in the first and second interlayer insulating layers, formed on the second interlayer insulating layer; a diffusion barrier layer formed on the ferroelectric capacitor; a third interlayer insulating layer formed on the second interlayer insulating layer and the diffusion barrier layer; a second metal line, which is electrically connected to the gate electrode, formed on the third interlayer insulating layer; a fourth interlayer insulating layer formed on the third interlayer insulating layer and the second metal line; and a third metal line, which is electrically connected to the ferroelectric capacitor, formed on the fourth interlayer insulating layer.

The present invention will now be described hereinafter with reference to the accompanying drawings in which preferred embodiments of the invention are shown. This invention may, however, be embodied in different forms and should not be construed as limited to the embodiments set forth herein. Rather, these embodiments are provided so that this disclosure conveys the scope of the invention to those skilled in the art. In the drawings, the thickness of layers and regions are exaggerated for clarity. It is also to be understood that when a layer is referred to as being "on" another layer or substrate, it can be directly on the other layer or substrate or intervening layers may also be present. Moreover, each embodiment described and illustrated herein includes its complementary conductivity type embodiment as well.

The invention may be understood and its features will become apparent to those skilled in the art by reference to the accompanying drawings.

DESCRIPTION OF THE ILLUSTRATIVE EMBODIMENT

Applicants' Korean Patent Application No. 99-30398, filed Jul. 26, 1999, is incorporated herein by reference as if fully set forth herein.

The formation of the FRAM cell includes certain process steps that are well known in the art. For example, the processes of photolithography, masking, and etching are used extensively in several embodiments of the present invention. One standard photolithographic process includes creating a photolithographic mask containing the pattern of the component to be formed; coating the wafer with a light sensitive material, such as a photoresist; exposing the photoresist-coated wafer to ultra-violet light through the mask to soften or harden various parts of the photoresist (depending on whether a positive or negative photoresist is used); removing the materials left unprotected by the photoresist; and then stripping the remaining photoresist. Another well-known process that is used extensively in this and many other integrated circuit fabrication processes is chemical mechanical polishing (CMP). These and other standard processes are referred to extensively herein without a detailed discussion of well-known technologies.

The ferroelectric capacitor is made by the process of depositing an adhesion layer, an oxidation barrier layer, a lower electrode layer, a ferroelectric layer, and an upper electrode layer. Through a photolithography process, the upper electrode layer, the ferroelectric layer, and the lower electrode layer are etched in the top surface of the oxidation barrier. Then, a diffusion barrier layer is deposited to protect the etched layers. Annealing is carried out to improve the barrier characteristics of the diffusion barrier layer. Using the diffusion barrier layer as a mask, which is defined by a photolithography process, the underlying oxidation barrier layer and adhesion layer are etched.

Figure 2:
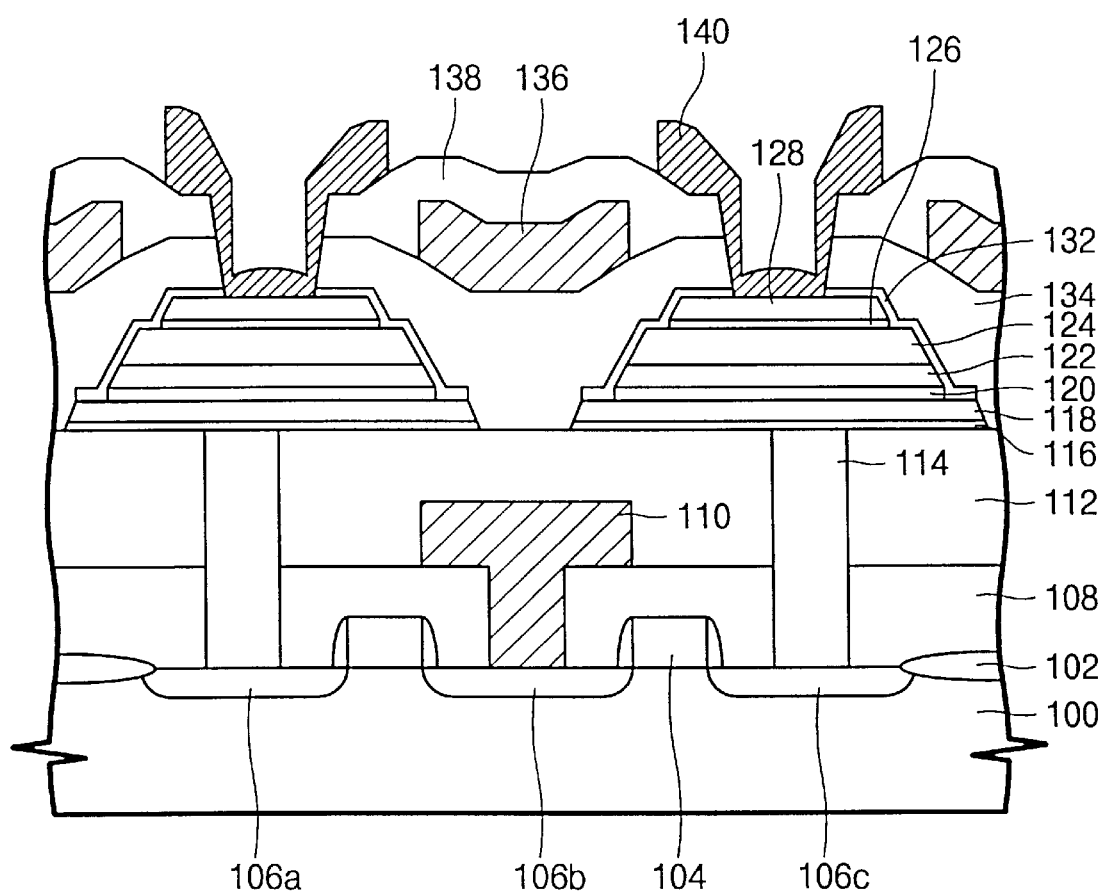
FIG. 2 is a cross-sectional view of a non-volatile triple metal line ferroelectric memory device according to an embodiment of the present invention.

FIG. 2 schematically shows a 1T/1C ferroelectric memory device in accordance with the present invention. The 1T/1C ferroelectric memory device is characterized in that it has triple wiring made of metal for high operational speed. The first metal line 110 is a data line, such as a bit line, which is electrically connected to one of source/drain regions 106b of the transistor 104 through a selected portion of the first interlayer insulating layer 108. The first metal line 110 is preferably made of tungsten (W). For memory device performance, the transistor 104 is electrically connected to a ferroelectric capacitor through a contact plug 114 formed in a selected portion of the second interlayer insulating layer 112 and the first interlayer insulating layer 108. The contact plug 114 is, preferably, made of a polysilicon. To improve adhesion and contact resistance characteristics, an adhesion layer 116 and an oxidation barrier layer 118 are disposed between the contact plug 114 and the ferroelectric capacitor (120, 122, 124, 126, 128). Furthermore, to prevent ferroelectric material diffusion, a diffusion barrier layer 132 covers the ferroelectric capacitor (120, 122, 124, 126, 128).

A third interlayer insulating layer 134 covers the ferroelectric capacitor (120, 122, 124, 126, 128) and the second interlayer insulating layer 112. The second metal line 136 is a strap line, shunting the gate electrode of the transistor 104. The second metal line 136 is formed on the third interlayer insulating layer 134 and is made of a multi-level metal layer of titanium (Ti), titanium nitride (TiN), aluminum (Al), and titanium nitride (TiN). The titanium (Ti) and titanium nitride (TiN) serve as a conventional barrier layer. The titanium nitride (TiN) layer, overlying the aluminum (Al), serves as an anti-reflection and protection layer. Though not shown in FIG. 2, the second metal line 136 also constitutes an interconnection in the core/peripheral region. A fourth interlayer insulating layer 138 covers the third interlayer insulating layer 134 and the second metal line 136. The third metal line 140, which is a plate line, is electrically connected to the upper electrode 128 of the ferroelectric capacitor through a selected portion of the third and fourth interlayer insulating layers (134, 138).

The formation of the 1T/1C ferroelectric memory device will now be fully described hereinafter with reference to FIGS. 3A–3G. In FIGS. 3A–3G, the same elements shown in FIG. 2, are identified with the same reference numbers.

Figure 3A:
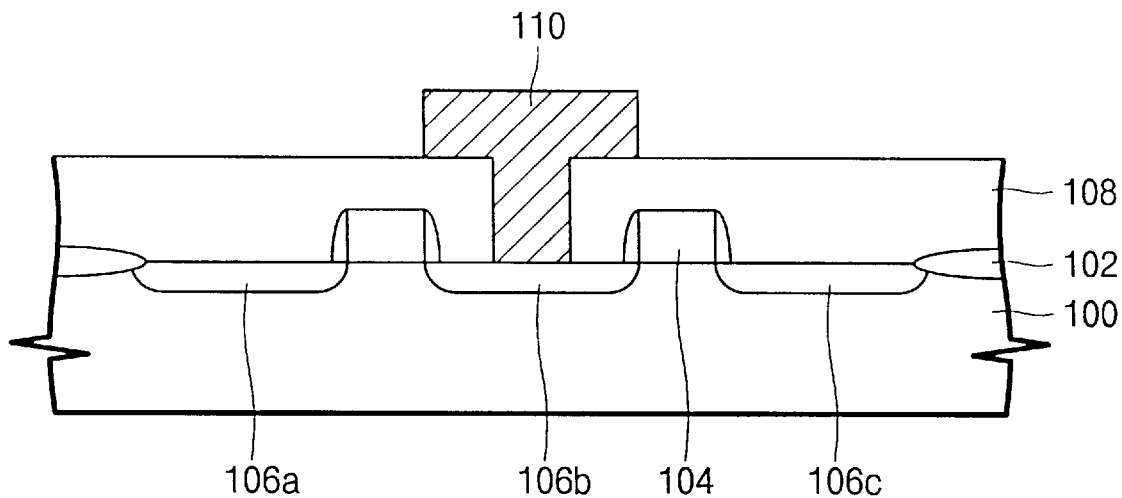
FIGS. 3A–3H are flow diagrams showing a method for fabricating the non-volatile ferroelectric memory device shown in FIG. 2.

Referring to FIG. 3A, a semiconductor substrate 100, preferably a silicon substrate, is disclosed. Active and inactive regions are defined by a device isolation process, which forms a device isolation region 102. Active regions are the regions where electrical connections are to be made. Local oxidation of silicon (LOCOS) techniques or shallow trench isolation (STI) techniques can be used for device isolation. Other suitable processes can also be employed.

After defining the active region, the transistor formation process is carried out. More particularly, a gate oxide layer (not shown) is formed on the silicon substrate 100 to provide an electrical separation between the silicon substrate 100 and the transistor 104. A gate electrode layer is deposited on the gate oxide layer and is patterned into predetermined configurations, i.e., gate electrodes. Only two gate electrodes are shown throughout the figures for clarity and will be referenced for a better understanding of the present invention. After forming the gate electrode, a conventional ion implanting process is carried out to form impurity diffusion regions, e.g. the source and drain regions 106a, 106c, and 106b in the silicon substrate 100. The source region 106c and the drain region 106b, the gate electrode therebetween constitute the transistor 104. Likewise, the source region 106a and the drain region 106b, the gate electrode therebetween also constitute another transistor. Then, sidewall spacers are formed on sidewalls of the gate electrode. The first interlayer insulating layer 108 is formed on the silicon substrate 100 and the transistor 104. The first interlayer insulating layer 108 is formed by a chemical vapor deposition (CVD) oxide, such as BPSG.

The process, in sequence, continues with the formation of the first metal line, i.e., a bit line for a data line. First, the first interlayer insulating layer 108 is etched to form a bit line contact hole, exposing the drain region 106b between the gate electrodes. A metal, such as tungsten (W), is deposited in the contact hole and on the first interlayer insulating layer 108 to a thickness of about 4,000 angstroms. The deposition of the tungsten (W) can be carried out by a sputtering technique. Other suitable techniques can also be employed. The deposited tungsten (W) is then patterned to form the first metal line 110 (bit line).

Figure 3B:
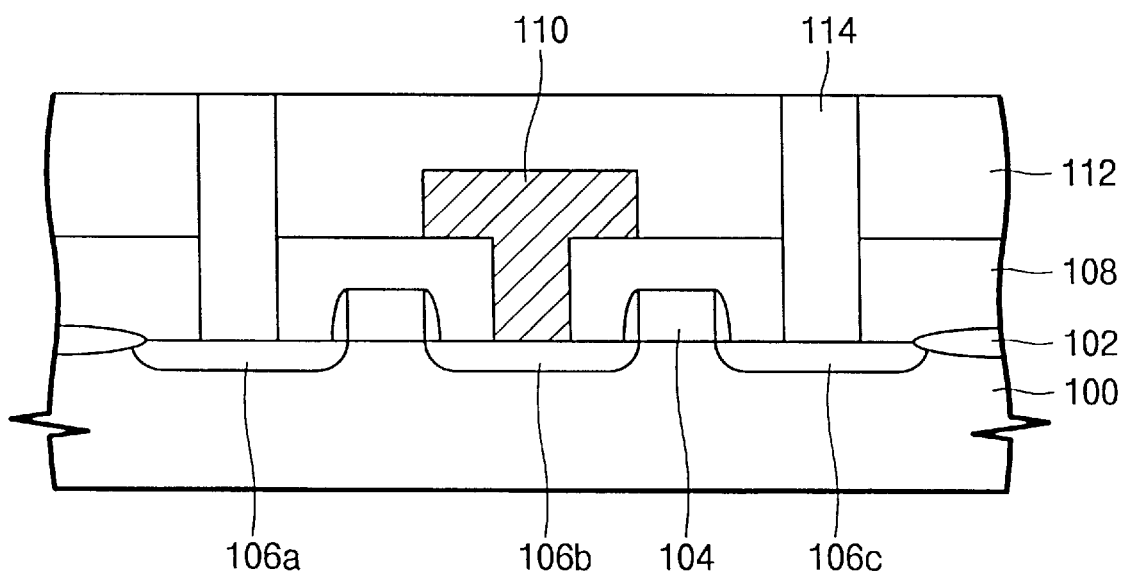

Referring to FIG. 3B, a second interlayer insulating layer 112 is deposited on the first interlayer insulating layer 108 and the first metal line 110. The second interlayer insulating layer 112 is formed by a CVD oxide process. To establish an electrical connection between the transistor 104 and the later-formed capacitor, a contact plug formation process is carried out in accordance with the present invention. First, the first and second interlayer insulating layers (108 and 112) are etched to form a contact hole for the capacitor, exposing the source region 106c. A conductive material, such as a polysilicon, is deposited in the contact hole and on the second interlayer insulating layer 112. Then, a planarization process, such as CMP, is preformed to form a contact plug 114, as shown in FIG. 3B.

Figure 3C:
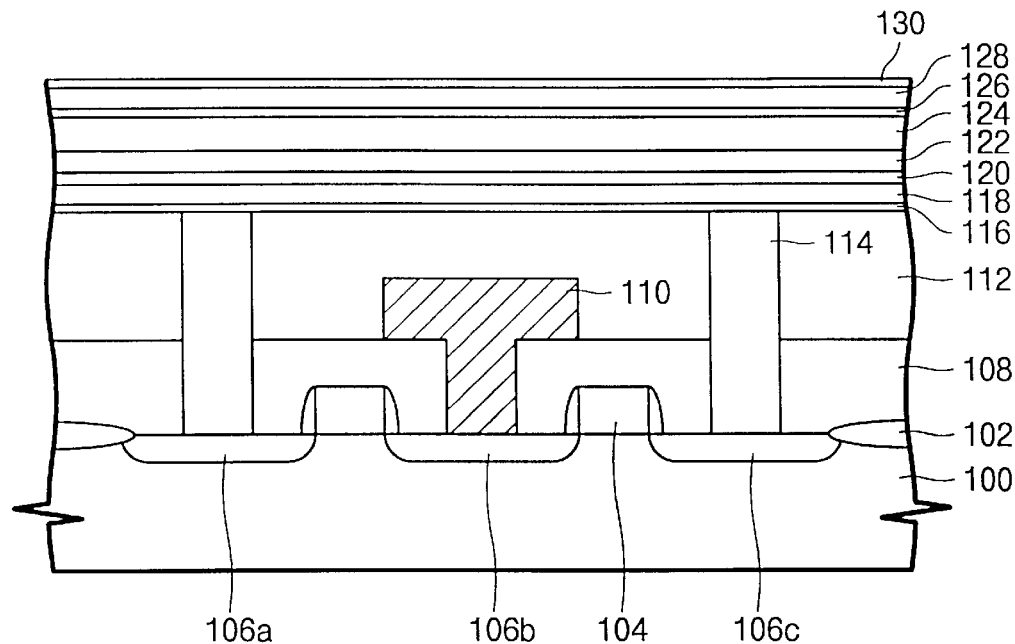

The formation of the ferroelectric capacitor, with reference to FIGS. 3C–3F will now be described. FIG. 3C shows an adhesion layer 116, an oxidation barrier layer 118, lower electrode layers 120 and 122, a ferroelectric film 124, upper electrode layers 126 and 128 and an oxide mask 130 being formed on the second interlayer insulating layer 112 and the contact plug 114. The adhesion layer 116 is made of titanium (Ti) by a sputtering method and is deposited on the second interlayer insulating layer 112 and the contact plug 114 to a thickness of about 50 angstroms. The titanium (Ti) serves to improve adhesion between the interlayer insulating layer 112 and the later-formed lower electrode 120 of the capacitor. The titanium (Ti) adhesion layer 116 also serves as an ohmic contact layer between the contact plug 114 and a later-formed ferroelectric capacitor. As a result, a reliable electrical ohmic contact between the buried contact plug 114 and the lower electrode 120 is obtained.

The oxidation barrier layer 118, preferably made from iridium (Ir), is deposited on the adhesion layer 116 by a sputtering technique to a thickness of about 1,000 angstroms. The oxidation barrier layer 118 prevents oxidation at the interface between the contact plug 114 and the lower electrode 120 of the capacitor during high temperature annealing. As described later, the oxidation barrier layer 118 is patterned after patterning of the capacitor and the diffusion barrier layer. As a result, the oxidation barrier layer 118 advantageously prevents oxide penetration. The oxidation barrier layer 118 can be made of rhodium (Rh) or ruthenium (Ru).

The lower electrode layer 120 is preferably made from iridium dioxide (IrO2) and the lower electrode layer 122 is preferably made from platinum (Pt). The iridium dioxide (IrO2) 120 is deposited to a thickness of about 500 angstroms by a direct current (DC) magnetron sputtering technique. After depositing, high temperature annealing is carried out in an ambient oxygen atmosphere at a temperature of about 600 degrees C. for the purpose of forming stable oxide electrode formations. The lower electrode layer 122 of platinum (Pt) is deposited to a thickness of about 1,000 angstroms by a sputtering technique. The platinum (Pt) lower electrode layer 122 exhibits a crystalline structure, which is preferable to the crystallization of the later-formed ferroelectric film.

Alternatively, the lower electrode of the capacitor can be formed as a single metal layer, such as platinum (Pt), iridium (Ir), rhodium (Rh), or the like. It is also possible to combine metal and the conductive oxide electrodes. Next, a ferroelectric film 124 is formed on the lower electrode 122. A ferroelectric precursor material is deposited amorphously by a sol-gel method. For example, a PZT film (about 2,000 angstroms thick) is deposited. Then, an annealing process is carried out to allow for phase transformation of the amorphous deposited layer into a crystalline phase, i.e., perovskite ferroelectric dielectric phase, which has the required ferroelectric dielectric characteristics. The annealing process is carried out at a temperature in excess of 650 degrees C. in an ambient oxygen atmosphere, preferably at a temperature of about 700 degrees C. for 10 minutes in a furnace. Rapid thermal annealing can also be used.

An oxide electrode layer 126 and a metal electrode layer 128 are deposited on the ferroelectric film 124 to form the upper electrode. The oxide electrode layer 126 is made of iridium dioxide (IrO2). The oxide electrode layer (IrO2) 126 is formed to a thickness of about 300 angstroms by a sputtering technique. The metal electrode layer 128 is made of iridium (Ir) and is formed to a thickness of about 1,200 angstroms by a sputtering technique. Alternatively, the upper electrode can be made of the same material and by the same process as the already-described lower electrode.

Figure 3D:
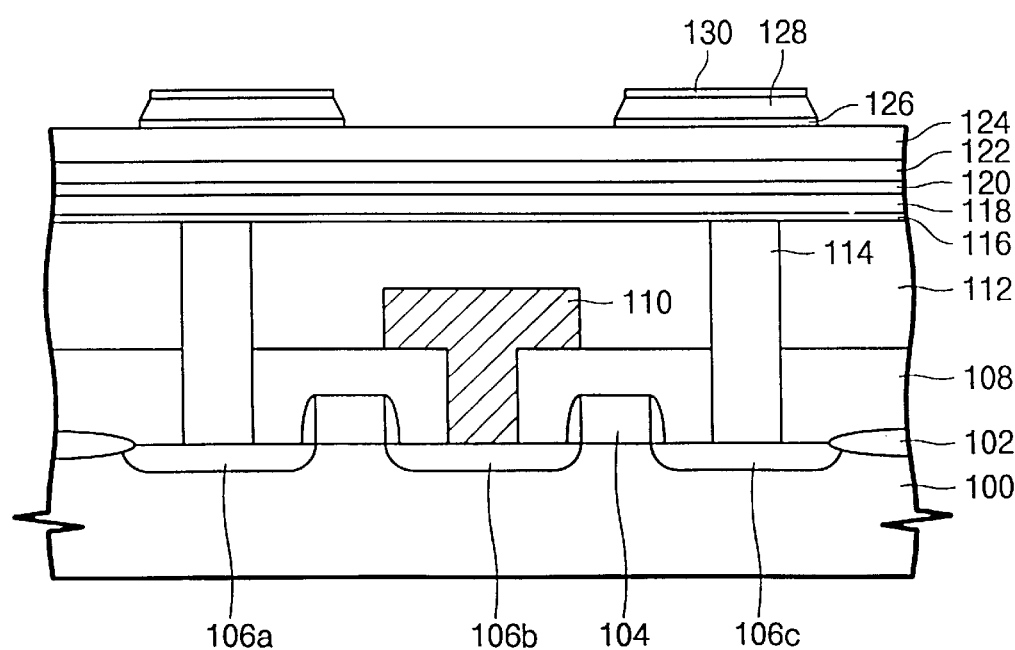
Figure 3E:
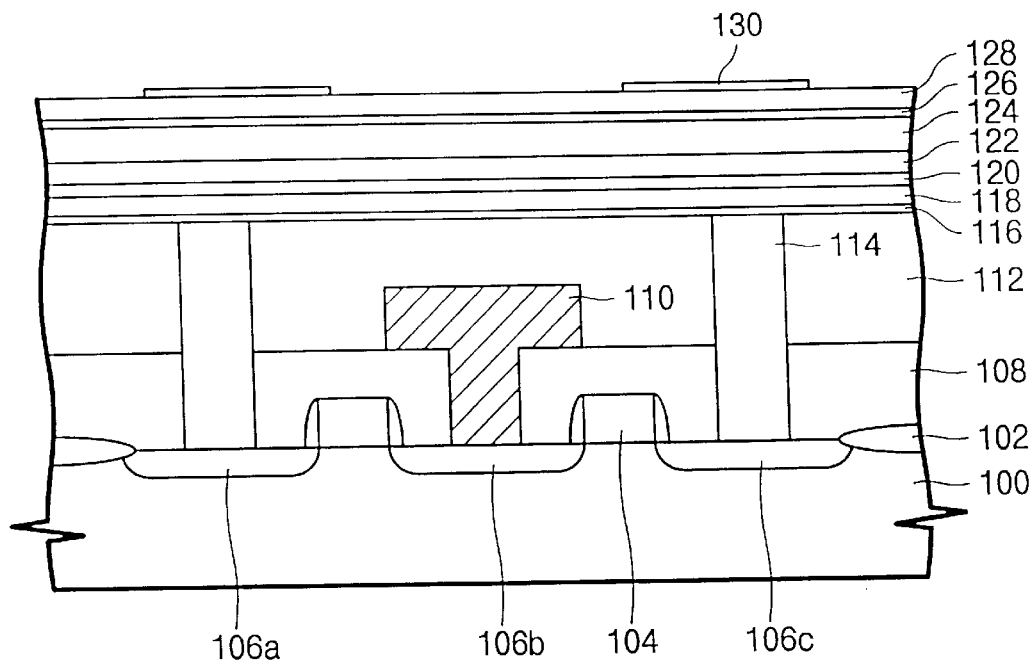

Next, the process continues with the photolithographic process for capacitor formation. The present invention uses an oxide mask 130 to form the capacitor. It should be noted that instead of using an oxide mask, a conventional photoresist mask could also be used. With reference to FIGS. 3D and 3E, the oxide mask 130 is patterned into a predetermined configuration which defines the ferroelectric capacitor regions. Then, using the patterned oxide mask 130, the underlying layers are etched down to the top surface of the oxidation barrier layer 118 thereby to form the ferroelectric capacitor.

The photolithographic process for capacitor formation can be carried out in various ways. A first way to make the capacitor is to etch the upper electrode layers 128 and 126, see FIG. 3E, using the patterned oxide mask 130, then to etch the ferroelectric film 124 and the lower electrode layers 122 and 120 using a photo-mask (not shown). The etching of the upper electrode layers 128 and 126 is carried out by using a gas mixture of chlorine ($Cl_2$), hydrogen bromide (HBr) and oxygen ($O_2$) with a flow rate of about 7:4:30 sccm at a pressure of about 5 mtorr.

Figure 3F:
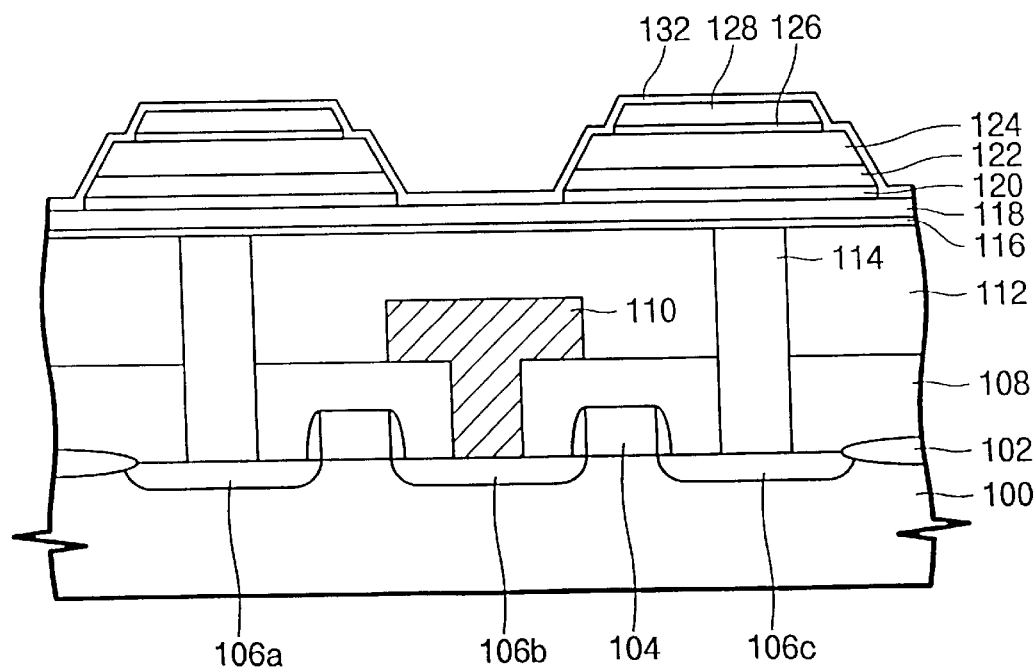

After removing the patterned oxide mask 130, a photo resist layer (not shown) is deposited and patterned into a desired configuration, i.e., the photo-mask (not shown). Using this photo-mask, the ferroelectric film 124 and the lower electrode layers 122 and 120 are etched to form a capacitor as shown in FIG. 3F. The etching of the ferroelectric film 124 and the lower electrode layers 122 and 120 is preferably done by using a reactive ion etching type etching apparatus. The ferroelectric film 124 is etched by using a gas mixture of argon (Ar), hydrogen bromide (HBr), and carbon tetra fluoride ($CF_4$). The lower electrode layers 122 and 120 are etched by using a gas mixture of argon (Ar) and chlorine ($Cl_2$). Alternatively, another conventional etching apparatus may be used in the semiconductor manufacturing process.

Another way to make the capacitor is to etch the upper electrode layers 128 and 126, ferroelectric film 124, and lower electrode layers 122 and 120 in one step by using a patterned oxide mask 130 (see FIGS. 3D and 3E).

Figure 1A:
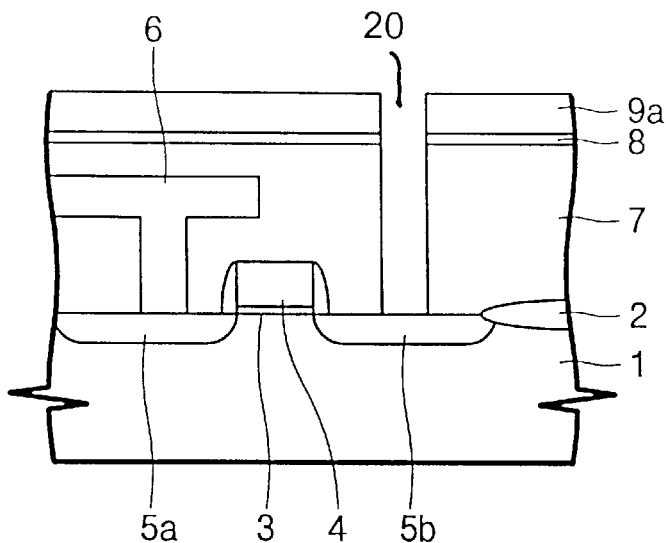
FIGS. 1A–1E are flow diagrams showing process steps for fabricating a non-volatile ferroelectric memory device according to a prior art.
Figure 1B:
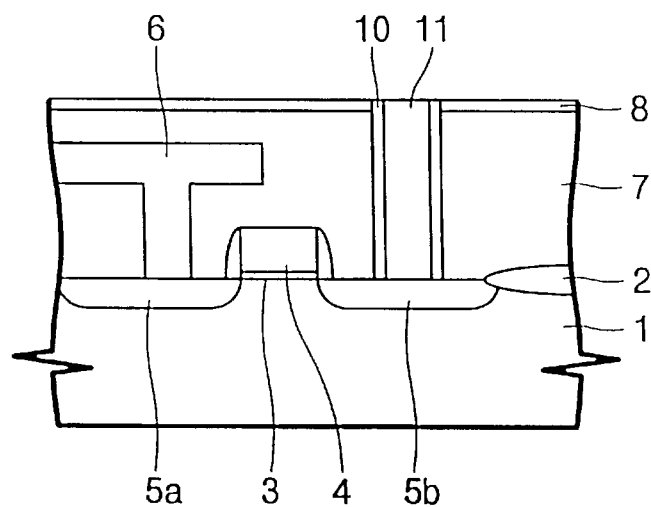
Figure 1C:
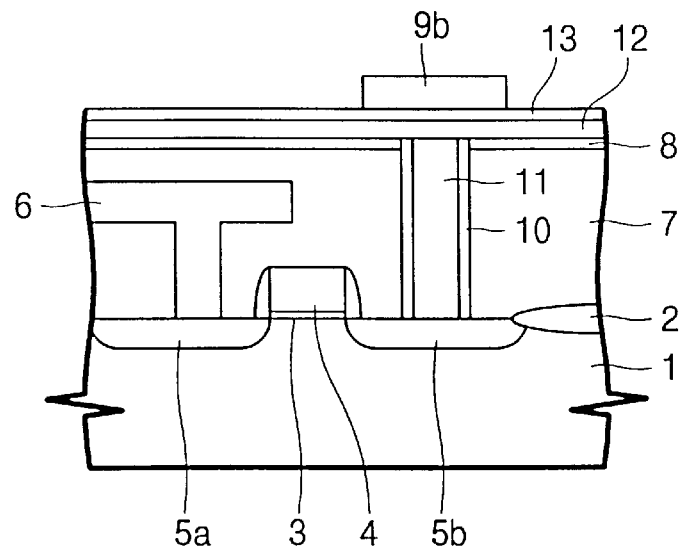
Figure 1D:
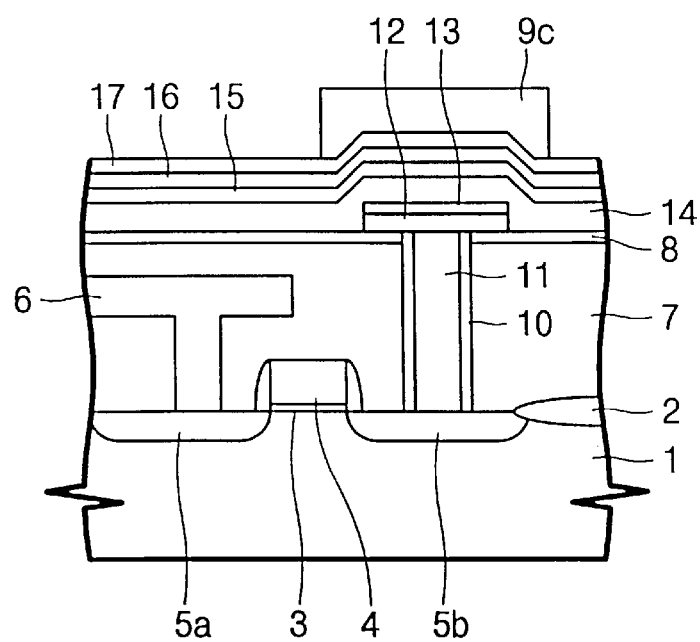
Figure 1E:
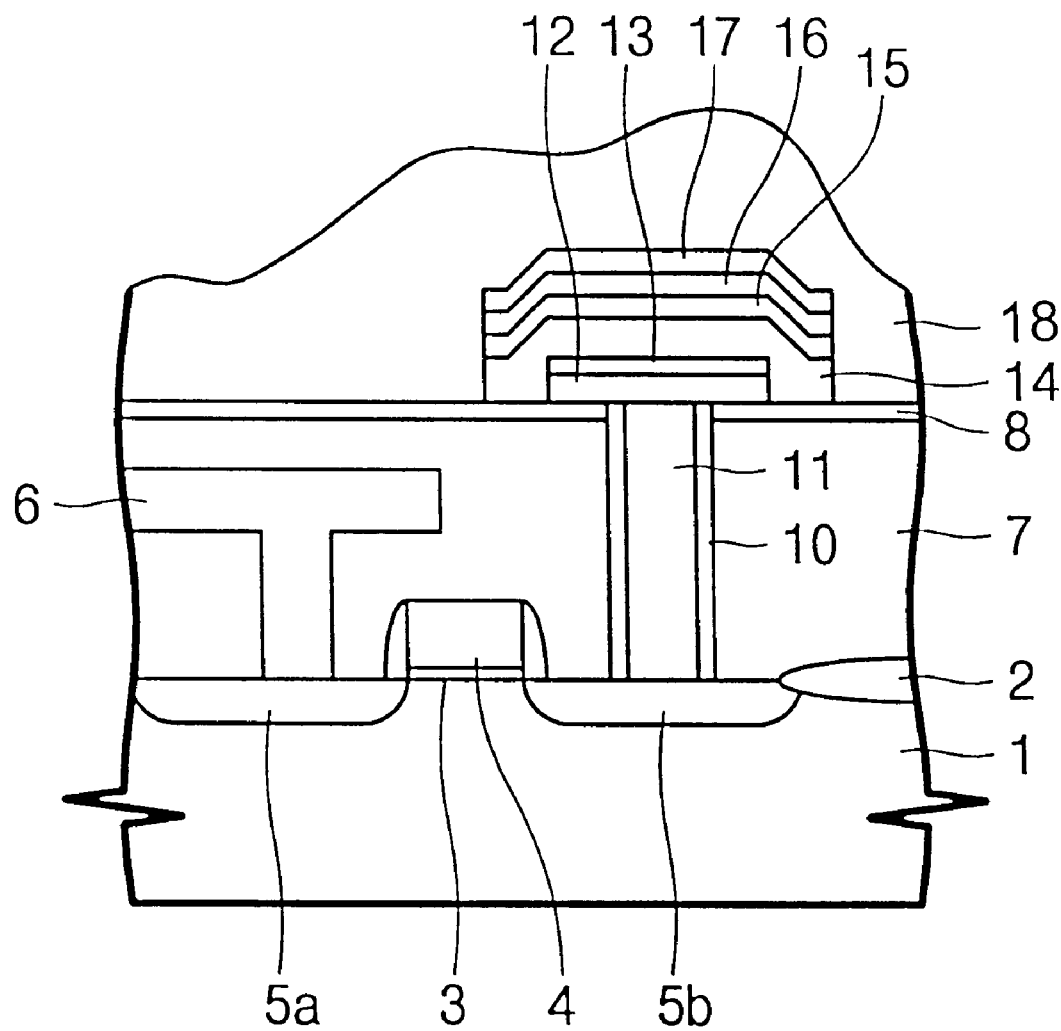

After patterning the ferroelectric capacitor, a diffusion barrier layer 132 is deposited thereon and on the second interlayer insulating layer 112, as shown in FIG. 3F. The diffusion barrier layer 132 prevents material from diffusing into and out of the ferroelectric capacitor region and may be made from titanium dioxide ($TiO_2$) or alumina ($Al_2O_3$). After depositing, an annealing process is carried out in an ambient oxygen atmosphere at a temperature of about 650 degrees C. for about 30 minutes in order to improve barrier characteristics. Unlike the prior art (see FIGS. 1D and 1E), the oxidation barrier layer remains as deposited (i.e., is not patterned) and sufficiently prevents oxygen diffusion into the contact plug 114, thereby providing a reliable electrical ohmic contact.

Figure 3G:
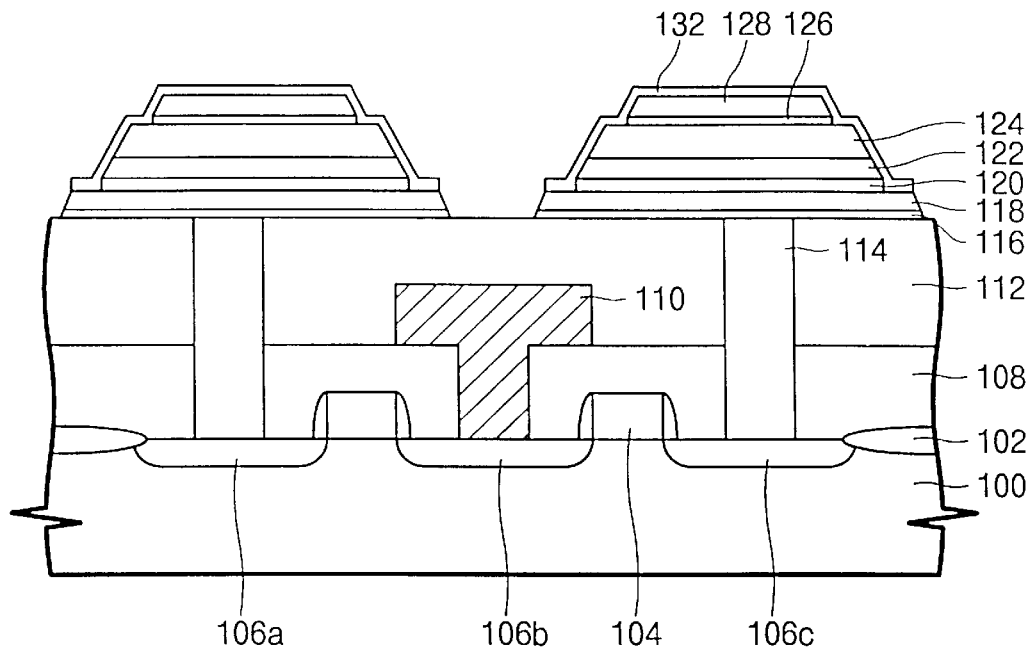

After annealing the diffusion barrier layer 132, the diffusion barrier layer 132 is patterned into a predetermined configuration by a photolithographic process. Using the pattern of the diffusion barrier layer, the underlying oxidation barrier layer 118 and adhesion layer 116 are etched to complete the ferroelectric capacitor, as shown in FIG. 3G.

Figure 3H:
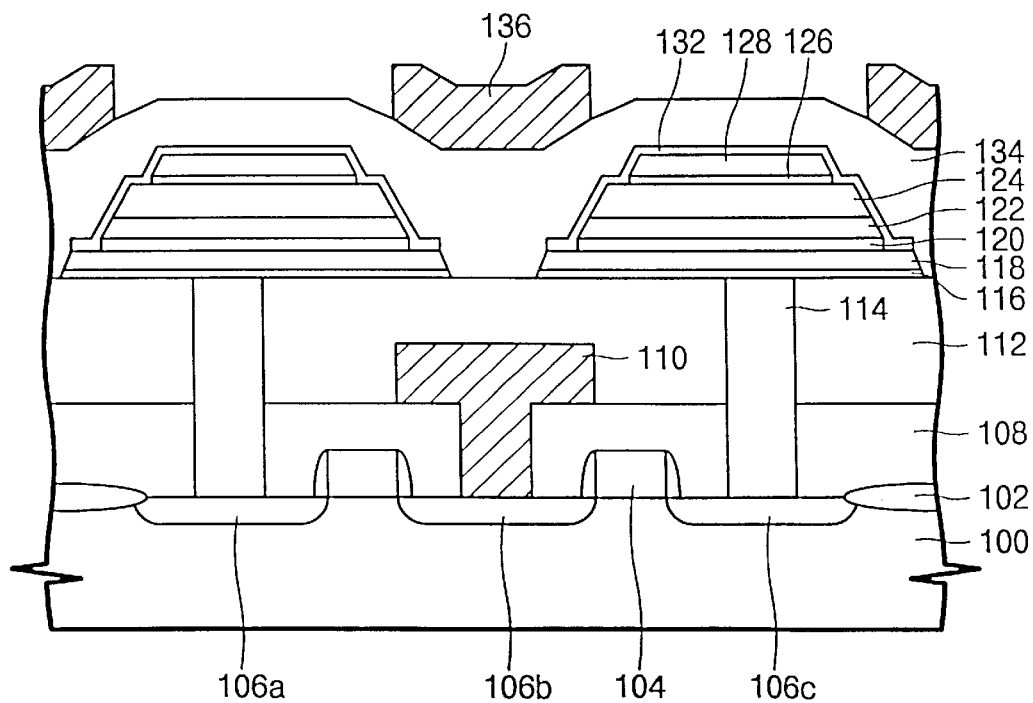

Continuing with the process sequence, a second metal line 136 is formed. As illustrated in FIG. 3H, a third interlayer insulating layer 134 is deposited on the ferroelectric capacitor and on the second interlayer insulating layer 112. Then the second metal line 136, which is electrically connected to the gate electrode of transistor 4 for shunting the gate electrode, is formed. Though not shown in the figures, the second metal line 136 is in the core/peripheral region, which serves as an interconnection. More particularly, the second metal line 136 is made of a multi-level metal structure of titanium (Ti), titanium nitride (TiN), aluminum (Al) and titanium nitride (TiN) to a thickness of about 300 angstroms, 600 angstroms, 4000 angstroms and 250 angstroms, respectively, by a sputtering technique. Titanium nitride (TiN) on aluminum (Al) serves to minimize critical dimensional variations during the photolithographic process. The titanium (Ti) and the titanium nitride (TiN) also serve as a reaction barrier layer. After depositing, the photolithographic process is carried out to form the second metal line 136.

Finally, the process sequence continues with the formation of a third metal line 140 (plate line), a shown in FIG. 2. After forming the second metal line 136, a fourth interlayer insulating layer 138 is deposited on the third interlayer insulating layer 134, including the second metal line 136. The fourth interlayer insulating layer 138 is made of oxide using a CVD method. The third metal line 140, which is electrically connected to the upper electrode of the ferroelectric capacitor, is then formed. More specifically, through a photolithographic process, a selected portion of the fourth interlayer insulating layer 138 is etched to form a contact hole, exposing part of the upper electrode 128. A metal, such as aluminum (Al), is deposited in the contact hole and on the fourth interlayer insulating layer 138 by a sputtering technique. Finally, through a photolithographic process, the deposited metal, such as aluminum (Al), is etched to form the predetermined third metal line 140.

The present invention provides a 1T/1C ferroelectric memory device and a method for fabrication thereof. The 1T/1C ferroelectric memory device is characterized in that it has a triple conductive line, which is made of a metal for high operation speed.

According to the present invention, the oxidation barrier layer is etched after the formation of the capacitor, and deposition and annealing of the diffusion barrier layer. Accordingly, the oxidation barrier layer sufficiently prevents oxidation of the contact plug during high temperature annealing.

While various features of the invention have been described with reference to the illustrated embodiments, it will be understood by those skilled in the art that various changes in form and details may be made without departing from the spirit and scope of this invention.

What is claimed is:

1. A one transistor and one capacitor ferroelectric memory device comprising:

a transistor that has a gate electrode and source/drain regions formed on a semiconductor substrate;

a first metal line electrically connected to one of the source/drain regions through a first interlayer insulating layer;

a second interlayer insulating layer formed on the first interlayer insulating layer and the first metal line;

a ferroelectric capacitor formed on the second interlayer insulating layer and is electrically connected to the other of the source/drain regions through a contact plug formed in the second and first interlayer insulating layers;

wherein the ferroelectric capacitor includes:
an adhesion layer formed on the second interlayer insulating layer;
an oxidation barrier layer formed on the adhesion layer;
a lower electrode formed on the oxidation barrier layer;
a ferroelectric film formed on the lower electrode; and
an upper electrode formed on the ferroelectric film;

a diffusion barrier layer formed on the ferroelectric capacitor;

a third interlayer insulating layer formed on the second interlayer insulating layer and the ferroelectric capacitor;

a second metal line, which is electrically connected to the gate electrode, formed on the third interlayer insulating layer;

a fourth interlayer insulating layer formed on the third interlayer insulating layer and the second metal line; and a third metal line, which is electrically connected to the ferroelectric capacitor, formed on the fourth interlayer insulating layer.

2. The device according to claim 1, wherein the first metal line is made of tungsten (W), the second metal line is made of a stacked layer of titanium (Ti), titanium nitride (TiN), aluminum (Al), and titanium nitride (TiN) and the third metal line is made of aluminum (Al).

3. The device according to claim 1, wherein the adhesion layer is made from titanium (Ti) and the oxidation barrier layer is made from a material selected from the group consisting of iridium (Ir), ruthenium (Ru) and rhodium (Rh).

4. The device of claim 1, wherein the diffusion barrier layer is made of a material selected from the group consisting of titanium dioxide ($TiO_2$) or alumina ($Al_2O_3$).

5. The device according to claim 1, wherein the lower electrode comprises an upper layer and a lower layer.

6. The device according to claim 5, wherein the lower layer of the lower electrode is made from iridium dioxide ($IrO_2$).

7. The device according to claim 5, wherein the upper layer of the lower electrode is made from platinum (Pt).

8. The device according to claim 1, wherein the upper electrode comprises an upper layer and a lower layer.

9. The device according to claim 8, wherein the lower layer of the upper electrode is made from iridium dioxide ($IrO_2$).

10. The device according to claim 8, wherein the upper layer of the upper electrode is made from iridium (Ir).

* * * * *